(12) United States Patent
Mimuro et al.

(10) Patent No.: US 8,421,176 B2
(45) Date of Patent: Apr. 16, 2013

(54) MOS SOLID-STATE IMAGE PICKUP DEVICE

(75) Inventors: Ken Mimuro, Osaka (JP); Jun Jisaki, Kyoto (JP)

(73) Assignee: Panasonic Corporation, Osaka (JP)

( * ) Notice: Subject to any disclaimer, the term of this patent is extended or adjusted under 35 U.S.C. 154(b) by 752 days.

(21) Appl. No.: 12/559,923

(22) Filed: Sep. 15, 2009

(65) Prior Publication Data

US 2010/0078748 A1 Apr. 1, 2010

(30) Foreign Application Priority Data

Sep. 26, 2008 (JP) .................................. 2008-247611

(51) Int. Cl.
*H01L 27/146* (2006.01)
(52) U.S. Cl.
USPC .................... 257/435; 257/294; 257/E31.121
(58) Field of Classification Search ................. 257/435, 257/294, E32.121
See application file for complete search history.

(56) References Cited

U.S. PATENT DOCUMENTS

| 5,399,888 A | 3/1995 | Nakashiba |
| 6,097,433 A | 8/2000 | Kawai et al. |
| 7,180,544 B2 | 2/2007 | Yamaguchi et al. |
| 2006/0103750 A1* | 5/2006 | Iwamoto ..................... 348/311 |

FOREIGN PATENT DOCUMENTS

JP 04-199875 7/1992

* cited by examiner

*Primary Examiner* — Jerome Jackson, Jr.
*Assistant Examiner* — Dale E Page
(74) *Attorney, Agent, or Firm* — McDermott Will & Emery LLP (57) ABSTRACT

A solid-state image pickup device relating to the present invention has a specific gap in a part of a lattice-shaped light blocking film pattern or wiring pattern having an opening enclosing a light reception region. Peripheral circuits and wiring layers on a pixel may be used as the light blocking film. In such a case, when multiple wiring layers are used as the light blocking film, layouts of a second and subsequent wiring layers is determined according to the layout of the first wiring layer above the light reception region. The specific gap is created in a part of the wiring enclosing the light reception region.

10 Claims, 10 Drawing Sheets

MOS SOLID-STATE IMAGE PICKUP DEVICE

CROSS-REFERENCE TO RELATED APPLICATION

The disclosure of Japanese Patent Application No. 2008-247611 filed Sep. 26, 2008 including specification, drawings and claims is incorporated herein by reference in its entirety.

BACKGROUND OF THE INVENTION

1. Field of the Invention

The present invention relates to a technique to obtain excellent images free from image defects such as stain spots without increasing process cost in a solid-state image pickup device such as a CCD (charger coupled device) or MOS (metal oxide semiconductor) image sensor having photoelectric conversion elements on a semiconductor substrate.

2. Description of the Related Art

The CCD image sensor as a solid-state image pickup device has photoelectric conversion elements, such as photodiodes, and a charge transfer path on a semiconductor substrate, wherein light emitted on the photoelectric conversion elements is converted to signal charge. The signal charge is transferred through the charge transfer path and output from the output part. On the other hand, the MOS image sensor has photoelectric conversion elements, such as photodiodes, and signal detection elements, such as transistors, in pixel cells on a semiconductor substrate, wherein light emitted on the photoelectric conversion elements is converted to signal charge. Signals corresponding to the charge amount of the converted signal charge are read from the signal detection element.

Among the MOS image sensors, the solid-state image pickup device using an amplifying MOS sensor has recently been drawing attention. This solid-state image pickup device is a device in which image signals are detected by a photodiode and amplified by a transistor in each pixel cell, characteristically having a high sensitivity. Such a solid-state image pickup device uses a dynamic shift register as a circuit for horizontally or vertically outputting signals from an image pickup region having a two-dimensional array of pixels. In this way, the circuit is simplified and the higher density and lower power consumption is achieved. The signal charge detected by a photodiode in each pixel cell is read by a transistor unique to the solid-state image pickup device and called a reading transistor. The signal charge is accumulated in a floating diffusion amplifier and then output by an amplifying transistor as signals.

In either one of the CCD image sensor and the MOS image sensor, the solid-state image pickup element has a light blocking film to cover everywhere except for the photodiode. The light blocking film prevents any light from directly entering anywhere but the photodiode and usually made of a metal such as aluminum and tungsten. In the CCD image sensor, light entering the charge transfer path causes some characteristic defects such as smear. On the other hand, in the MOS image sensor, light entering the signal detection element causes some failures such as transistor malfunction. For this reason, the light blocking film is generally provided on everywhere except for the photodiode.

Figure 8:
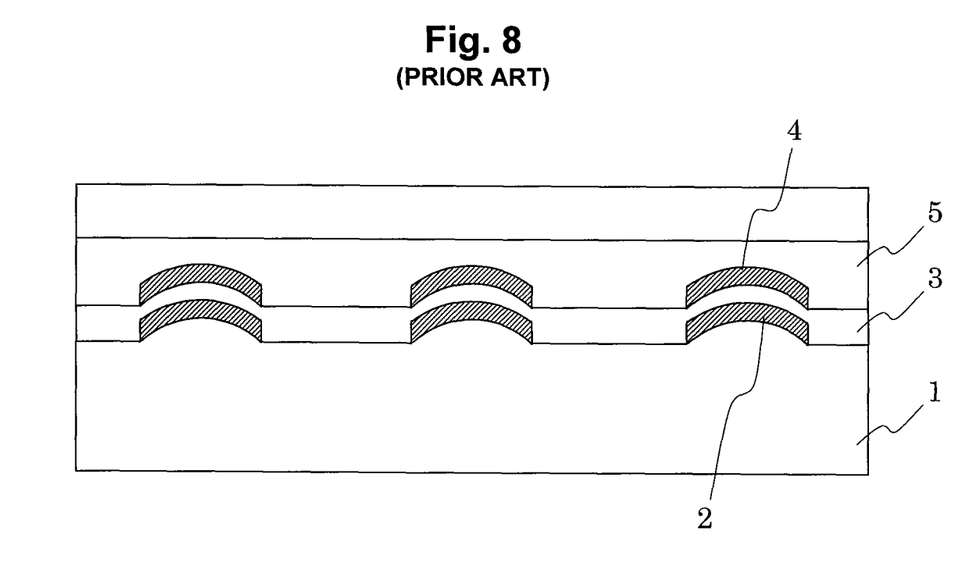
FIG. 8 is a cross-sectional view of a circuit pattern of a conventional semiconductor device.

FIG. 8 is a cross-sectional view of a conventional solid-state image pickup device described in the Japanese Laid-Open Patent Application Publication No. 4-199875. In this prior document, for example, a first aluminum light blocking film 2 is provided on the surface of a semiconductor substrate 1 on which a MOS or CCD image pickup element is formed, covering the photodiode. Then, a second light blocking film 4 is provided on the first light blocking film 2 via a flattening film 3. The second light blocking film 4 covers projections formed on the surface of the first light blocking film 2 in conformity to domed projections formed on the surface of the semiconductor substrate 1, preventing irregular reflection on these parts. Formed on the flattened film (the flattening film 3), the second light blocking film 4 has little bumps and prevents irregular reflection. A flattening film 5 is formed on the second light blocking film 4.

Figure 9:
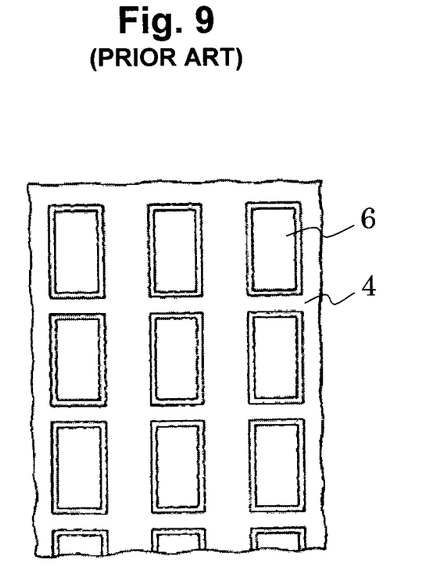
FIG. 9 is a plane view of a circuit pattern of a conventional semiconductor device.

FIG. 9 is a plane view showing a layout of the solid-state image pickup device described in the above prior document. The first light blocking film 2 of this exemplary pattern has openings 6, where the first light blocking 2 is absent, in accordance with the regions where the photodiodes are formed. The second light blocking film 4 covers almost everywhere except for the openings 6 of the first light blocking film 2. As just described, the light blocking film is formed in a lattice pattern so as to enclose each photodiode formed on the light reception region of the solid-state image pickup device.

SUMMARY OF THE INVENTION

As described above, the solid-state image pickup device has a light blocking film in the form of a lattice for which a metal such as aluminum and tungsten is used. A problem was found that stain-like image defects occur in the process of forming the light blocking film having a lattice pattern. The light blocking film is formed into a desired pattern by forming a metal film such as an aluminum or tungsten film on an inter-wiring later insulating film above the photodiodes and performing anisotropic plasma etching using a photoresist mask. After the anisotropic etching, a cleaning process is added to remove polymers, namely reaction products between the etching gas and metal materials, and particles. The cleaning process largely consists of steps of spraying a chemical on the semiconductor substrate, rotating the semiconductor substrate at a high speed to spin off and dry the sprayed chemical, and rinsing it with purified water (deionized water).

In this cleaning process, an underlaying interlayer insulating film below the metal film is etched by generally extensively used cleaning chemicals although the etching rate is very small. It was confirmed by the inventors of the present invention that gentle undulation (uneven etching) occurs over an extensive area on a chip where each image pickup element is formed on a wafer, causing stained images.

It was also found by the inventors of the present invention that the stained image occurs because the cleaning chemical remains in the lattice pattern of the light blocking film after the cleaning process and forms a chemical reservoir.

Figure 10:
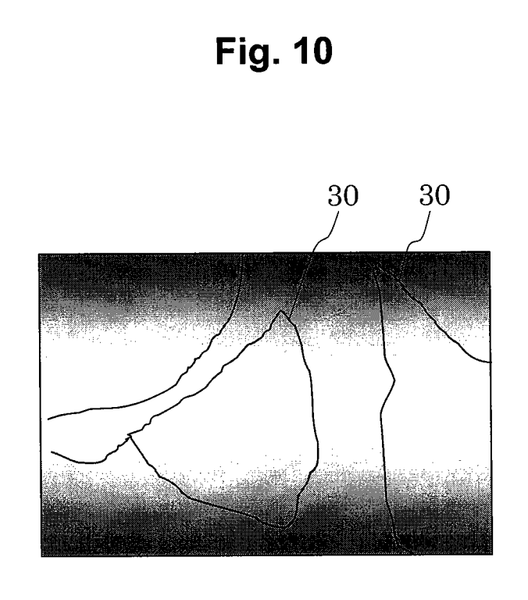
FIG. 10 is an illustration showing stain spots that have occurred.

FIG. 10 is an optical micrograph of a solid-state image pickup device chip. Thin lines 30 are observed in an extensive area on the chip. The brightness is different between inside and outside the lines and, therefore, the image seems to have stains. In FIG. 10, the thin lines of stains are emphasized by solid lines.

The purpose of the present invention is to provide a solid-state image pickup device in which an occurrence of stain-like patterns on an array of pixel cells is prevented without increasing a production cost, whereby the above described occurrence of stain spots or image defects is prevented and excellent images are obtained.

The present invention is characterized in that a specific gap is created in a part of a lattice-shaped light blocking film pattern or wiring pattern having an opening enclosing a light reception region of the solid-state image pickup device.

More specifically, the solid-state image pickup device is supposed to be a solid-state image pickup device comprising a two-dimensional array of multiple pixel cells each having a photodiode and a floating diffusion temporarily holding charges generated by the photodiode on a semiconductor substrate.

In such a solid-state image pickup device, a light blocking film in a form of a lattice pattern enclosing the photodiode and having an opening directly above the photodiode in each of the pixel cells is provided. In such a case, the light blocking film is provided over a region where multiple pixel cells are formed on the semiconductor substrate via an interlayer insulating film. Then, the lattice pattern constituting the light blocking film is partly cut out to create a gap in each of the pixel cells.

Peripheral circuits and wiring layers on the pixel may be used as the light blocking film. In such a case, when multiple wiring layers are used as the light blocking film, layouts of a second and subsequent wiring layers is determined according to the layout of the first wiring layer above the light reception region. A specific gap can be created in a part of the wiring enclosing the light reception region.

In the present invention, the gap provided in a part of the pattern serves as a discharge port for the chemical reservoir in the lattice that occurs because of the lattice pattern in the cleaning process after anisotropic etching for forming the light blocking film and wiring layers. Then, the chemical circulation efficiency on the wafer in a spinning off step for spin drying is improved and no chemical is retained in the lattice pattern. Consequently, no uneven etching occurs in an interlayer insulating film above the light reception region, preventing the occurrence of stain spots or image defects. In this way, a solid-state image pickup device in which the occurrence of stain spots or image defects is prevented and excellent images are obtained without increasing the production cost can be provided.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Figure 1A:
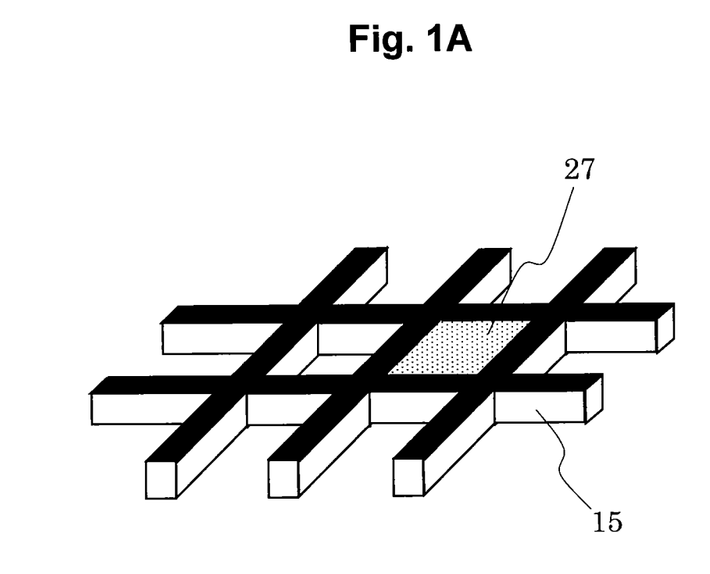
FIGS. 1A and 1B are plane views for explaining a cause of stain patterns.
Figure 1B:
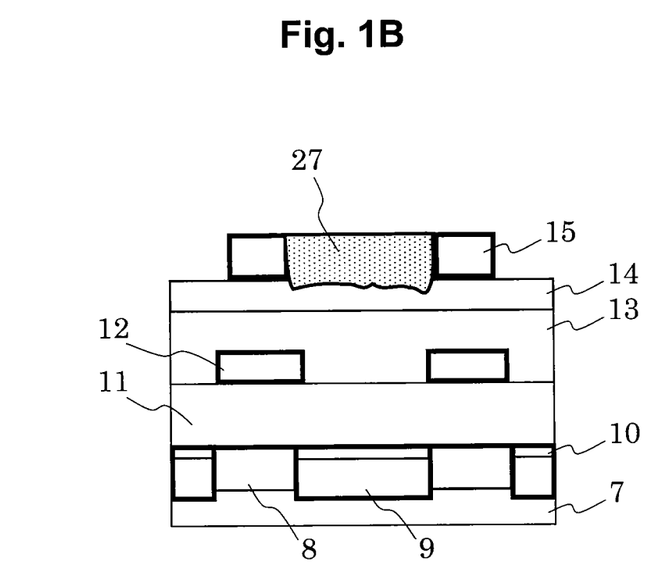

The inventors of the present invention further reviewed a cause of stain pattern in the pixel cell array region of a solid-state image pickup device. FIG. 1A is a perspective view of a light blocking film and FIG. 1B is a cross-sectional view of a pixel cell part of a solid-state image pickup device. A basic structure will be described with reference to FIG. 1B. On an N-type silicon substrate 7, an element separation film 8 is formed, a two-dimensional array of multiple photodiodes 9 is provided, and a P-type surface shielding layer 10 is provided thereon. Above them, a first interlayer insulating film 11, a first wiring layer 12, a second interlayer insulating film 13, a fluorine diffusion inhibiting film 14 and a second wiring layer 15 are further formed. FSG (fluorinated silicate glass) is sometimes used for the second interlayer insulating layer 13 and, therefore, a p-SiON film 14 is used as the fluorine diffusion inhibiting film 14.

Both the first wiring layer 12 and the second wiring layer 15 serve as a light blocking film in FIG. 1B. More specifically, as shown in FIG. 1A, the second wiring layer 15 has a lattice form and effectively blocks light entering the photodiode 9 in four directions. The stain pattern presumably occurs while forming the second wiring layer 15. As described above, the second wiring layer 15 is patterned by anisotropic etching and cleaned for removing polymers. In this process, a chemical is sprayed on the lattice of the second wiring layer 15 and the chemical enters the lattice domains enclosed by the second wiring layer 15.

In general semiconductor integrated circuit patterns, the cleaning chemical is spun off in a spin drying step in which the substrate is rotated at a high speed and, therefore, no chemical reservoir occurs. However, in this particular "lattice" pattern, walls formed by the sidewalls of the second wiring layer 15 (light blocking film) and the surface tension of the chemical prevent the chemical from being spun off. For this reason, presumably, the chemical is stochastically retained as a chemical reservoir 27 and entirely fills an opening of the lattice as shown in FIGS. 1A and 1B. The cleaning chemical etches the underlaying p-SiON film 14. The p-SiON film 14 is reduced in thickness differently between the lattice in which the chemical reservoir 27 is present and the lattice in which the chemical reservoir 27 is absent, resulting in uneven etching.

The pixel having the chemical reservoir is extensively distributed in groups. The uneven region and even region are different in the reflectance and transmittance and look differently under the optical microscope. Because of unevenness in thickness of the p-SiON film 14, the reflectance and transmittance from the p-SiON film 14 to the first interlayer insulating film 11 varies place by place, presumably causing stain spots or image defects. It is more difficult to spin off the chemical reservoir because of influence of the surface tension as the lattice size is decreased. The stain spots as shown in FIG. 10 will become a significant problem in obtaining excellent images as the pixel cell size is decreased. The present invention is made based on the above finding.

Figure 2:
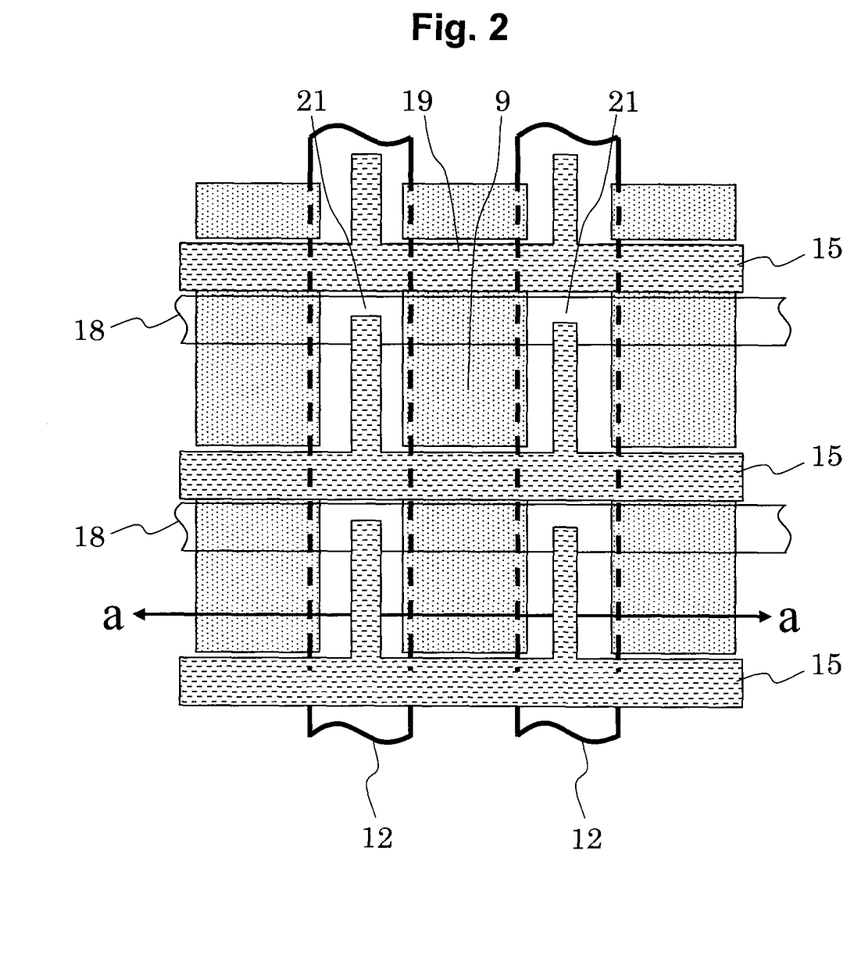
FIG. 2 is a plane view showing a circuit pattern of a solid-state image pickup device in an embodiment relating to the present invention.
Figure 3:
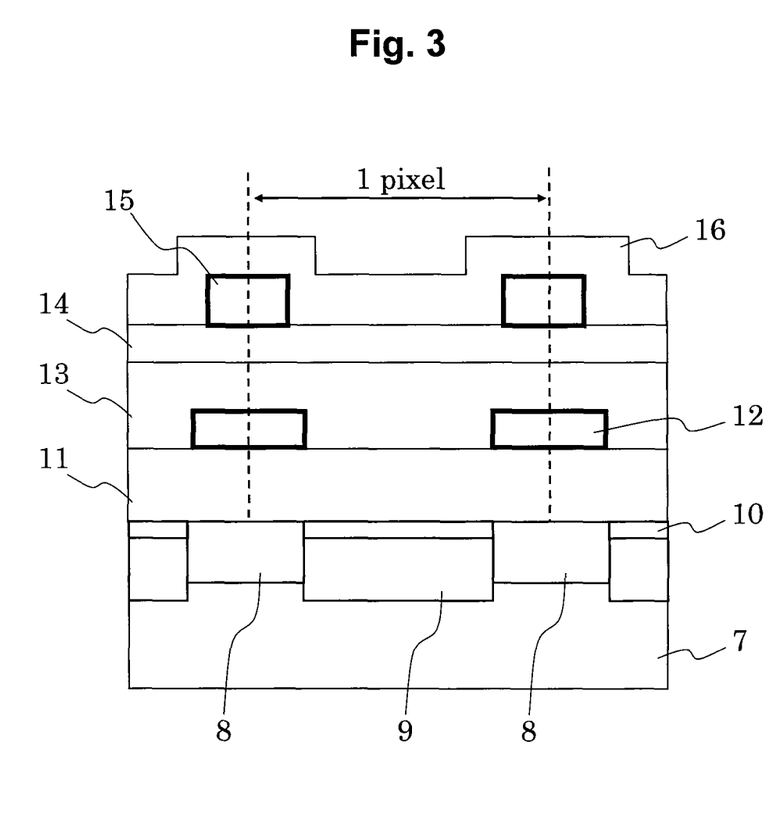
FIG. 3 is a cross-sectional view showing a circuit pattern of a solid-state image pickup device in an embodiment relating to the present invention.

FIG. 2 is an illustration showing a pattern layout in a pixel cell part of a MOS solid-state image pickup device in an embodiment relating to the present invention. FIG. 3 is a cross-sectional view at a line a-a in FIG. 2. First, the cross-sectional structure will be described with reference to FIG. 3. In the pixel cell part, an element separation film 8 and a photodiode 9 are formed on an N-type Si substrate 7. On the N-type Si substrate 7, a plurality of photodiodes 9 is arranged in a two-dimensional array. A surface shielding layer 10 consisting of a P-type impurity region is provided on each photodiode 9. A first interlayer insulating layer 11 is formed on the photodiode 9. A first wiring layer 12 and a second interlayer insulating layer 13 are further provided thereon. A fluorine diffusion inhibiting film such as a p-SiON film 14 is further provided thereon. A second wiring layer 15 is further provided thereon. A protective film 16 such as a p-SiN film is further provided thereon.

BPSG (boro-phospho silicate glass) is used for the first interlayer insulating film 11 and a TEOS (tetra-ethyl-orthosilicate) silicon oxide film and fluorine-containing FSG are used for the second interlayer insulating film 13. They are each formed by CVD (chemical vapor deposition) at a temperature of approximately 700° C. Particularly, FSG is sometimes used for the second interlayer insulating film 13 in order to reduce a coupling capacitance between the patterns of the first wiring layer 12; therefore, the p-SiON film 14 for inhibiting fluorine diffusion is formed on the second interlayer insulating film 13. A metal such as aluminum or aluminum alloy is used for the first wiring layer 12 and second wiring layer 15, serving as wiring for circuit operations and as a light blocking film for preventing light from entering anywhere other than the photodiode region. In FIG. 3, the first wiring layer 12 and second wiring layer 15 serve as a light blocking film.

The second wiring layer 15 has a lattice pattern (see FIGS. 1A and 1B), effectively blocking light entering in four directions. The first wiring layer 12 has a linear pattern as described later with reference to FIG. 2, mainly serving as the wiring for operation of a transistor in the pixel. Furthermore, the first wiring layer 12 is placed directly above the transistor, assisting the second wiring layer 15 in blocking light to prevent malfunction of the transistor. The protective film 16 formed on the second wiring layer 15 protects the surface.

FIG. 2 is the plane view of the pattern layout in the pixel cell part in this embodiment. In FIG. 2, only major components of the pixel cell part are shown and the other components unnecessary for explanation of the present invention are omitted. Some reference numbers are further omitted for simplicity in FIGS. 4 to 7. Please be aware that the same kinds of lines and shadings refer to the same components as those in FIG. 2.

Although not shown in FIG. 2, there is an active region between the photodiodes 9 where a pixel derive transistor is formed and a reading gate 18 for reading pixel signals and a floating diffusion 19 for accumulating read charge are formed. The floating diffusion 19 is formed at a side of the photodiode 9 (an upper side in FIG. 2) and below the second wiring layer 15 described later. The reading gate 18 is treated with a metal such as Ti and Co to form a silicide (not shown in FIG. 3).

The first wiring layer 12 (the lower film) is provided in a space between the arrays of multiple photodiodes 9 and extended in one direction, namely in the vertical direction in FIG. 2. In this way, the first wiring layer 12 serves as a light blocking film covering directly above the active region where the pixel drive transistor is formed, thereby preventing the transistor from malfunctioning due to incident light. The second wiring layer 15 encloses each photodiode 9 and also serves as a light blocking film. The present invention is characterized in that the second wiring layer 15 (light blocking film) has a gap 21 or a cutout in a part directly above the first wiring layer 12. At least one gap 21 is provided between the regions of the photodiodes 9 or on either side of the floating diffusion 19.

The gap 21 serves as a discharging port to prevent the chemical from staying in the lattice pattern in the cleaning process after anisotropic etching for forming the second wiring layer 15. In the cleaning process, a batch cleaning equipment is mainly used. First, a chemical composed mainly of dimethylformamide is sprayed on multiple semiconductor substrates stored in a cassette to remove polymers. Then, the cassette is rotated to spin off the chemical in the wafer circumferential direction by centrifugal force in a chemical spinning off step. Then, the wafers are rinsed with purified water and dried by high temperature (exceeding the room temperature) $N_2$ drying or IPA (iso propyl alcohol) drying in a drying step; then, the series of operations is completed.

Here, the lattice-shaped second wiring layer 15 has the gap 21, which provides a covert channel for the retained cleaning chemical for removing polymers in the lattice pattern of the second wiring layer 15 in the chemical spinning off step of the cleaning process. In this way, the chemical discharge efficiency in spinning off the chemical on the wafer in the wafer circumference direction by centrifugal force is improved and no chemical reservoir occurs. Then, uneven etching of the underlaying interlayer insulating film 14 below the second wiring layer 15 serving as a light blocking film does not occur above the light reception region and the occurrence of stain spots or image defects is prevented. The gap 21 can be provided anywhere on a one side of the second wiring layer 15 that is located directly above the first wiring layer 12 without any problem.

Figure 4:
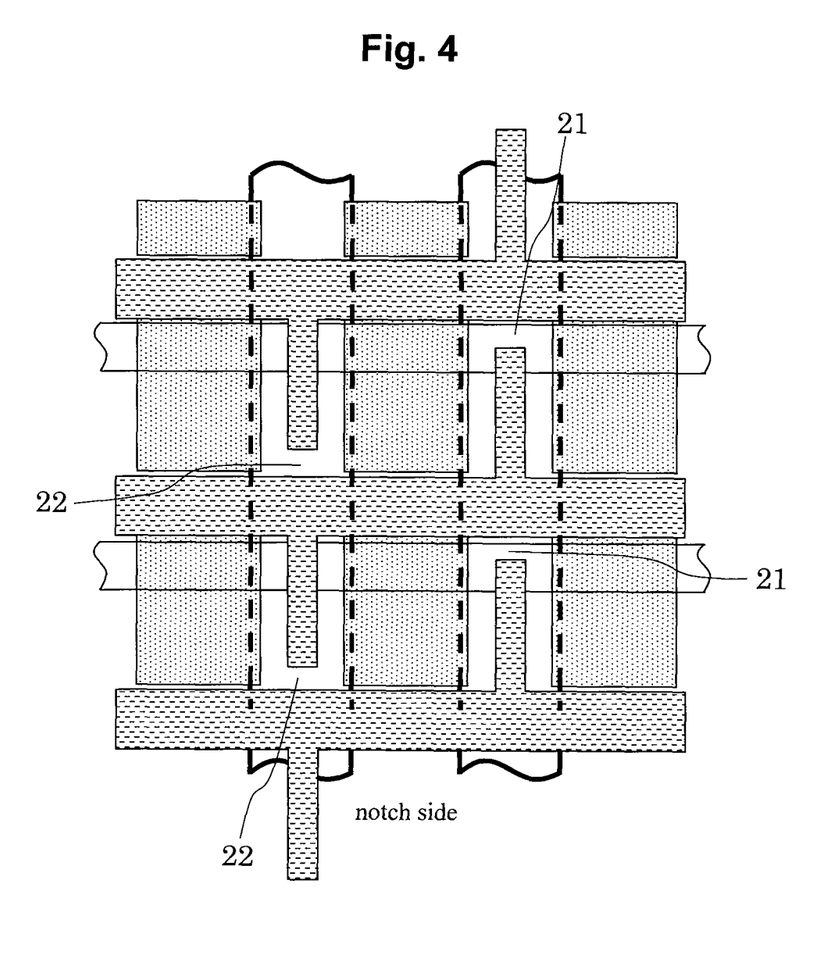
FIG. 4 is a plane view showing an exemplary gap position in an embodiment relating to the present invention.

FIG. 4 is an illustration showing a second aspect of a position of the gap 21 formed in the second wiring layer 15. One gap 21 is provided at one corner of the lattice pattern and another gap 22 is provided on a diagonal line passing through the one gap 21. Centrifugal force occurs in the wafer circumferential direction in the chemical spinning off step of the cleaning process. Therefore, in the lattice-shaped wiring pattern, the gaps are so provided as to allow the chemical to be discharged from the inner to outer side on the wafer, improving the chemical discharge efficiency.

Figure 5:
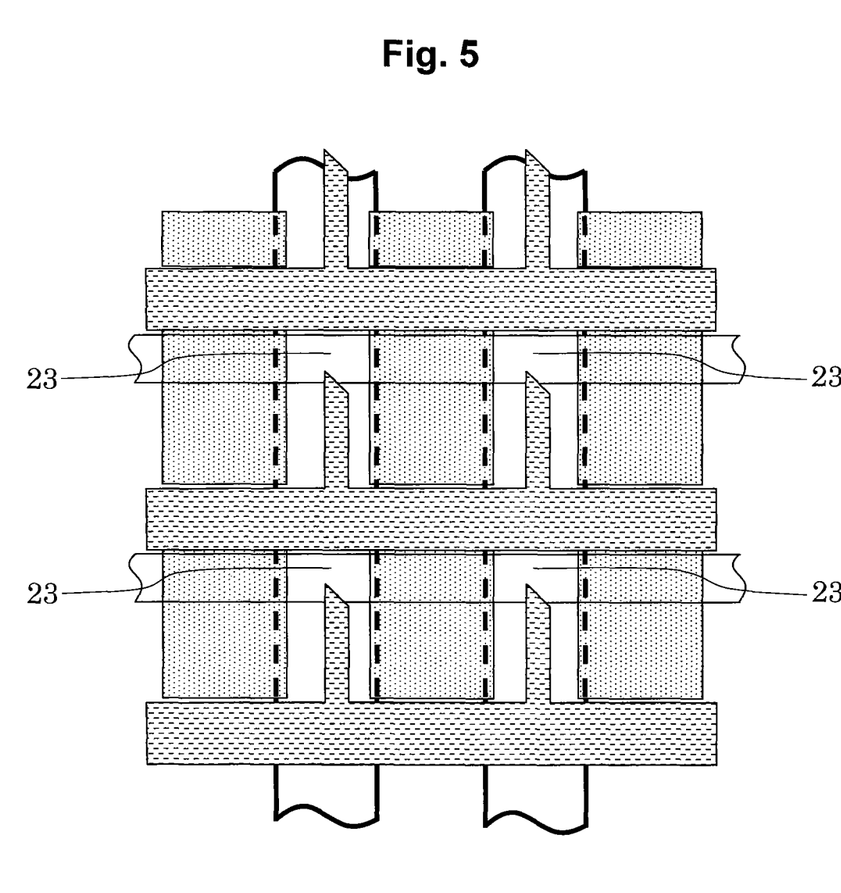
FIG. 5 is a plane view showing an exemplary gap shape in an embodiment relating to the present invention.
Figure 6:
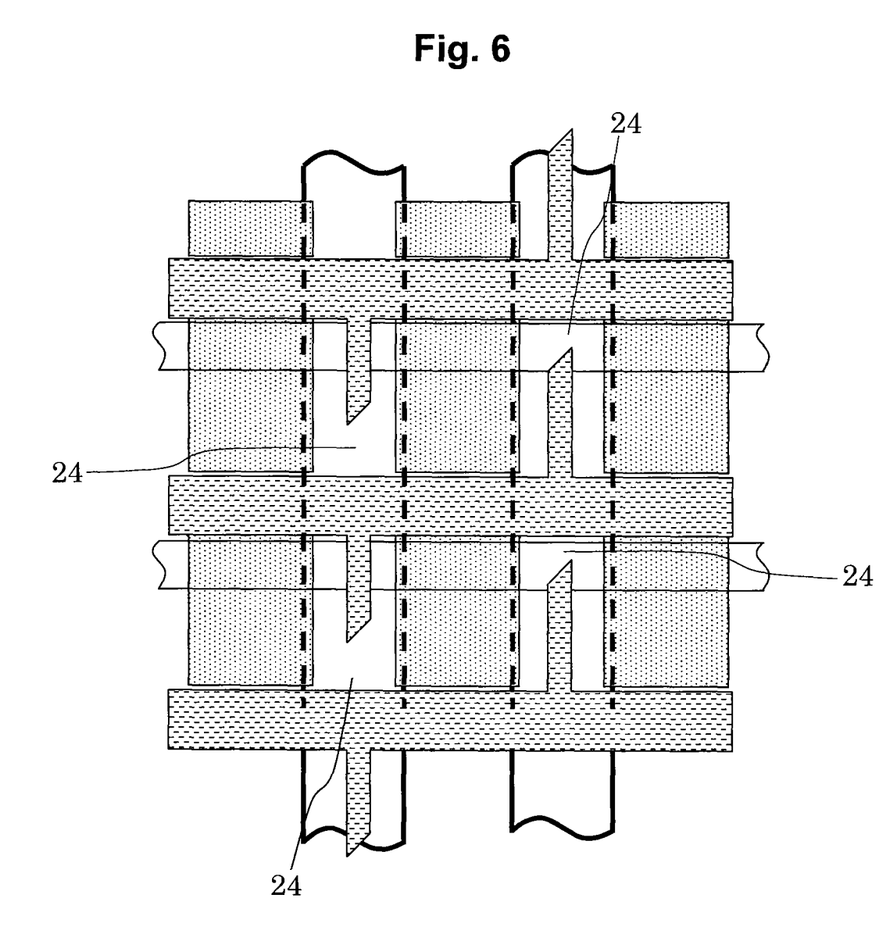
FIG. 6 is a plane view showing another exemplary gap position in an embodiment relating to the present invention.

FIG. 5 is an illustration showing another aspect of a shape of the gap 21 formed in the second wiring layer 15. A gap 23 is characterized by a skewed discharge port with an increased length inside the pattern so that the chemical applied inside the pattern of the second wiring layer 15 is easily discharged along the wafer rotation direction during the spin drying. In this way, the chemical discharge efficiency is expected to be increased. Furthermore, as shown in FIG. 6, the layout in FIG. 4 is applied to the shape of the gap 23 in FIG. 5 so that the skewed gaps 24 are provided at diagonally opposite positions in the lattice.

Here, it is desirable that the gap 21, 22, 23, or 24 is larger than 1/10 of one side of a pixel cell or the pixel cell pitch and smaller than 3/10 of the same in view of the pixel size and light blocking effect. The gap 21, 22, 23, or 24 is formed in the part of the second wiring layer 15 that is located directly above the first wiring layer 12. Therefore, light entering through the gap 21, 22, 23, or 24 is blocked by the underlaying first wiring layer 12 so that the light blocking efficiency does not drop. In this way, the first wiring layer 12 also serves as a light blocking film as described above.

Figure 7:
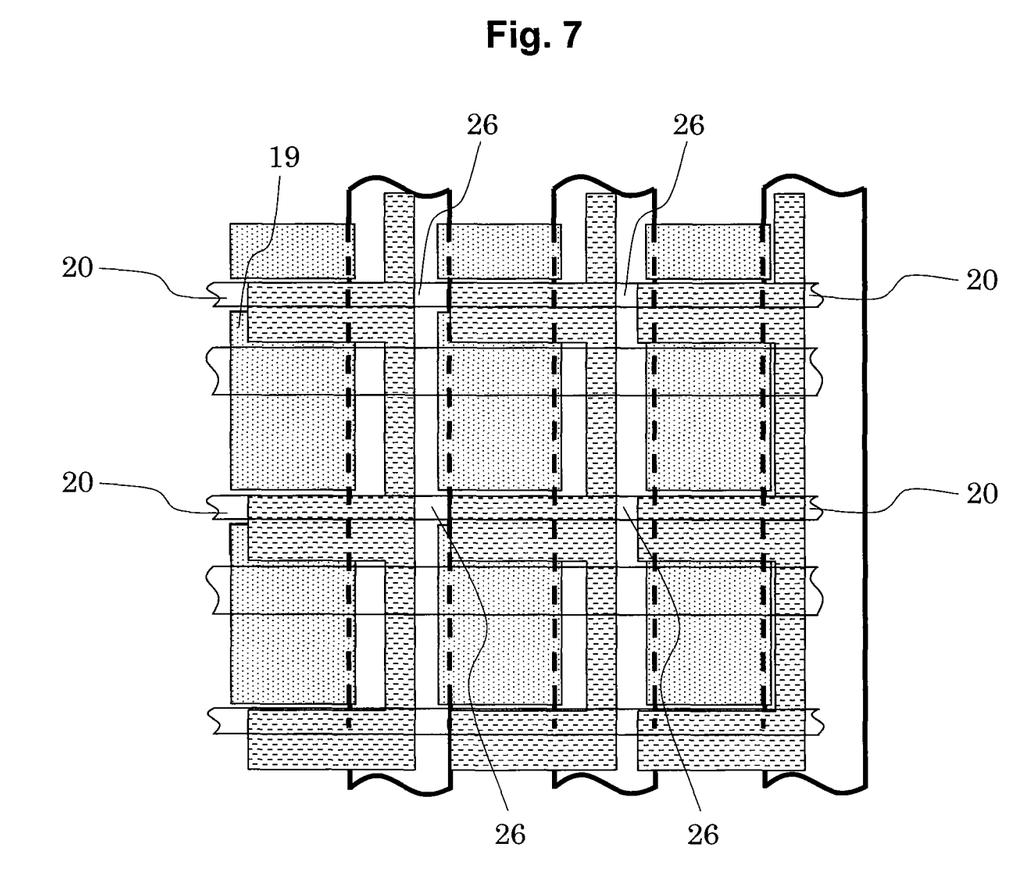
FIG. 7 is a plane view showing a further other exemplary gap position in an embodiment relating to the present invention.

FIG. 7 is an illustration showing another aspect of a position of a gap 26 formed in the second wiring layer 15. A not shown active region where a pixel drive transistor is formed is formed between the photodiodes 9 and a reading gate for reading image signals and a floating diffusion 19 for accumulating read charge are formed. A reset gate 20 (underlaying film) serving as a gate electrode of a rest transistor for resetting the charge read in the reading operation and as wiring is formed on the element separation film between the photodiode 9 and floating diffusion 19. The gates are treated with a metal such as Ti and Co to form a silicide. The first wiring layer 12 is provided directly above the active region where a pixel drive transistor is formed, preventing the transistor from malfunctioning due to incident light.

The second wiring layer 15 serving as a light blocking film encloses the region of the photodiode 9 and forms a lattice pattern in the pixel cell. The gap 26 is formed in a part of the second wiring layer 15 at one corner and at another vertically opposite corner of the lattice constituting the second wiring layer 15. The gap 26 can be provided anywhere on a one side of the second wiring layer 15 that is located directly above the reset gate 20 provided on the element separation film without any problem. Having a polysilicon film body and a refractory metal silicide surface, the reset gate 20 has a significantly small light transmittance and useful as a light blocking film. Therefore, the gap 26 can be provided in the part of the second wiring layer 15 that is located directly above the reset gate 20.

The reset gate 20 directly below the gap 26 is formed on the element separation film 8, not on the transistor part, and serves only as signal transfer wiring. There is no need of concerning malfunction due to light entering through the gap 26. The gap 26 can be provided at diagonally opposite positions in the lattice pattern of the second wiring layer 15 as shown in FIG. 4. The gap can have a skewed shape by obliquely cutting out the wiring constituting the lattice pattern of the second wiring layer 15 as shown in FIG. 5.

As described above, the present invention provides specific gaps in the second wiring layer 15 so that the chemical is not retained in the lattice pattern of the second wiring layer 15 in the cleaning process after anisotropic etching for forming the light blocking film and wiring patterns. Therefore, the interlayer insulating layer 14 above the light reception region is not subject to uneven etching and no stain spot or image defect occurs. Then, excellent images can be obtained without increasing process cost.

The technical scope of the present invention is not restricted by the above described embodiments and various modifications and applications can be made without departing from the technical idea of the present invention beside what is described above.

As described above, the present invention can provide a solid-state image pickup device in which the occurrence of stain spots or image defects while forming the wiring and light blocking film is prevented without increasing a process cost and excellent images are obtained. Therefore, it is significantly useful in manufacturing solid-state image pickup devices.

What is claimed is:

1. A solid-state image pickup device including:
   a two-dimensional array of multiple pixel cells each having a photodiode, a floating diffusion formed in a semiconductor substrate, and a reading gate and a reset gate which are disposed on the semiconductor substrate;
   an interlayer insulating film formed on the semiconductor substrate, the reading gate and the reset gate; and
   a light blocking film formed on the interlayer insulating film, wherein:
   the light blocking film is formed in a form of a lattice pattern having a plurality of horizontal patterns and vertical patterns and enclosing the photodiode and has an opening directly above the photodiode in each of the pixel cells, and
   the light blocking film has a gap provided at a part of the lattice pattern to partially divide the lattice pattern.

2. The solid-state image pickup device according to claim 1, wherein an underlaying film is provided in a region between a photodiode and an adjacent photodiode below the light blocking film.

3. The solid-state image pickup device according to claim 2, wherein the underlaying film is provided directly below said light blocking film.

4. The solid-state image pickup device according to claim 2, wherein the underlaying film is a wiring layer.

5. The solid-state image pickup device according to claim 3, wherein the underlaying film is a wiring layer.

6. The solid-state image pickup device according to claim 2, wherein the underlaying film is a gate wiring of a drive transistor.

7. The solid-state image pickup device according to claim 3, wherein the underlaying film is a gate wiring of a drive transistor.

8. The solid-state image pickup device according to claim 1, wherein a pair of the gaps is provided on a diagonal line in one pixel cell.

9. The solid-state image pickup device according to claim 1, wherein the gap has a skewed shape in relation to the lattice pattern.

10. The solid-state image pickup device according to claim 1, wherein the gap is $1/10$ of a side of the pixel cell or larger in size.

* * * * *